(12) United States Patent
Zhu et al.

(10) Patent No.: US 6,297,163 B1
(45) Date of Patent: Oct. 2, 2001

(54) METHOD OF PLASMA ETCHING DIELECTRIC MATERIALS

(75) Inventors: Helen Zhu, Milpitas; Roger F. Lindquist, Campbell, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/163,301

(22) Filed: Sep. 30, 1998

(51) Int. Cl.$^7$ .................. H01L 21/302; H01L 21/461
(52) U.S. Cl. ...................... 438/707; 438/714; 438/723
(58) Field of Search ...................... 438/692, 695, 438/700, 702, 706, 709, 712, 723, 743, 725

(56) References Cited

U.S. PATENT DOCUMENTS

| | | |
|---|---|---|
| 5,013,398 | 5/1991 | Long et al. . |
| 5,013,400 | 5/1991 | Kurasaki et al. . |
| 5,021,121 | 6/1991 | Groechel et al. . |
| 5,022,958 | 6/1991 | Favreau et al. . |
| 5,269,879 | 12/1993 | Rhoades et al. . |
| 5,366,590 * | 11/1994 | Kadomura ................ 156/662 |
| 5,529,657 | 6/1996 | Ishii . |
| 5,595,627 | 1/1997 | Inazawa et al. . |
| 5,611,888 | 3/1997 | Bosch et al. . |
| 5,736,457 | 4/1998 | Zhao . |
| 5,770,098 | 6/1998 | Araki et al. . |
| 5,780,338 | 7/1998 | Jeng et al. . |
| 5,843,847 * | 12/1998 | Pu et al. .................. 438/723 |
| 5,858,878 * | 1/1999 | Toda ....................... 438/723 |
| 5,880,837 * | 3/1999 | Arleo ...................... 438/740 |
| 5,972,235 * | 10/1999 | Brigham et al. ........... 216/49 |
| 6,171,974 * | 1/2001 | Marks et al. .............. 438/723 |

FOREIGN PATENT DOCUMENTS

| | | |
|---|---|---|
| 0 651 434 | 5/1995 | (EP) . |
| 0 726 596 | 8/1996 | (EP) . |
| 0 805 485 | 11/1997 | (EP) . |
| 0 908 940 | 4/1999 | (EP) . |

* cited by examiner

Primary Examiner—Benjamin L. Utech
Assistant Examiner—Duy-Vu Deo
(74) Attorney, Agent, or Firm—Burns, Doane, Swecker & Mathis, LLP

(57) ABSTRACT

A semiconductor manufacturing process wherein deep and narrow 0.3 micron and smaller openings are plasma etched in a dielectric layer such as doped and undoped silicon oxide. The etching gas includes at least one fluorocarbon reactant and carbon monoxide and optionally a carrier gas such as Ar. The etching process is carried out in a high density plasma reactor and is effective to etch the dielectric layer with high selectivity to the masking layer and/or a stop layer. The process is useful for etching 0.25 micron and smaller contact or via openings in forming structures such as damascene structures.

27 Claims, 6 Drawing Sheets

Post-etch Condition

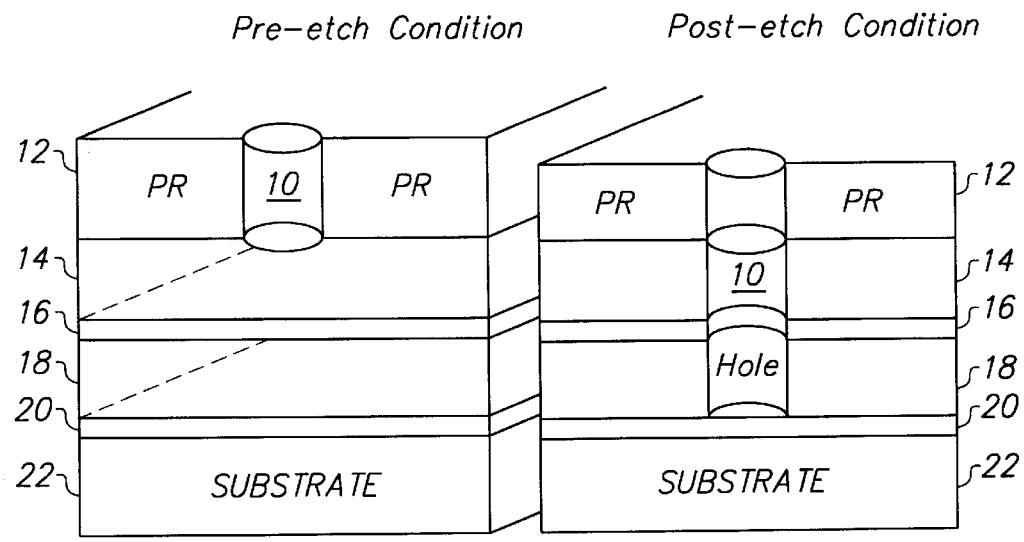
FIG. 1A      FIG. 1B
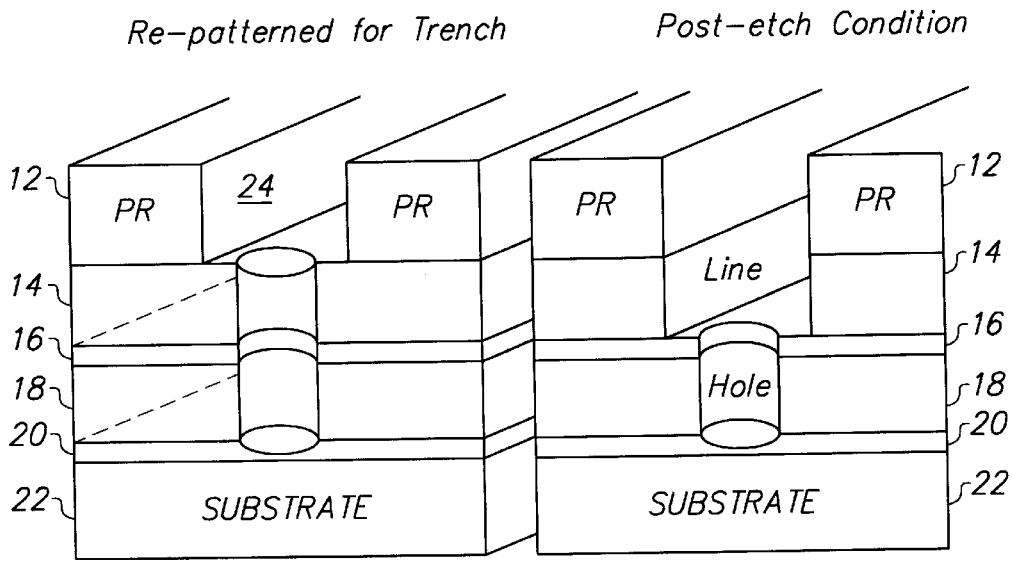
FIG. 1C      FIG. 1D

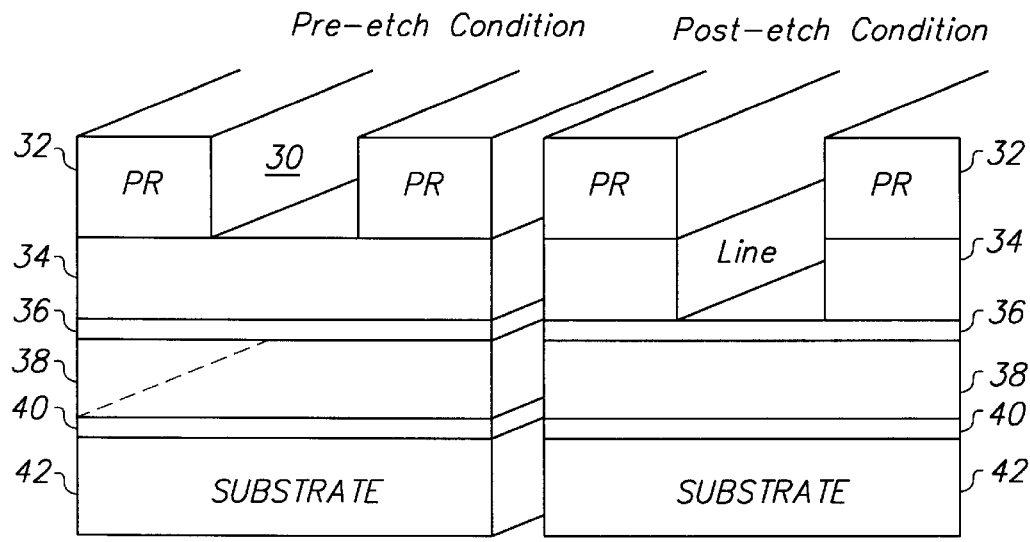
FIG. 2A  FIG. 2B
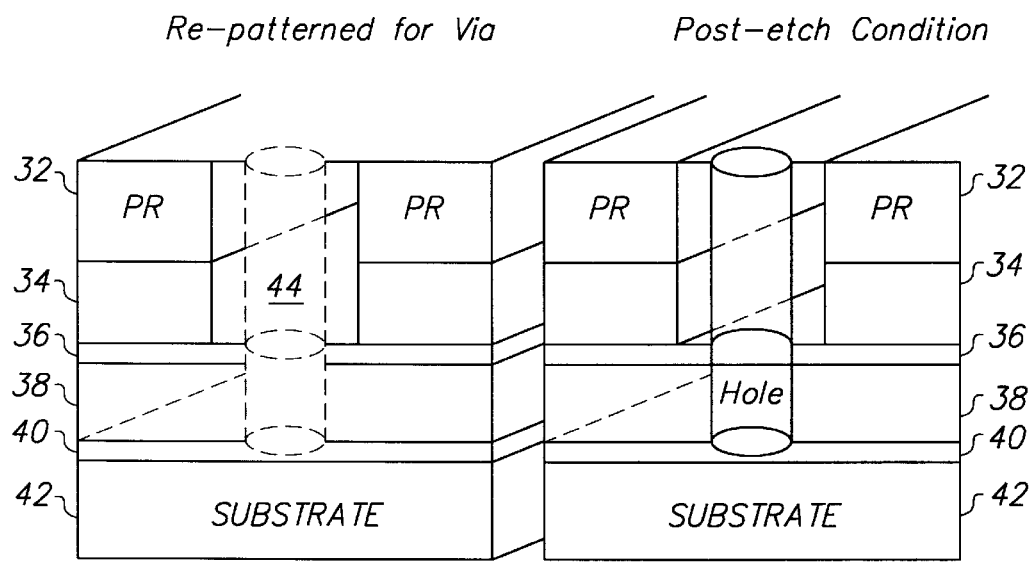
FIG. 2C  FIG. 2D

METHOD OF PLASMA ETCHING DIELECTRIC MATERIALS

FIELD OF THE INVENTION

The present invention relates to an improved method for plasma etching dielectric materials such as silicon oxide in the fabrication of integrated circuits.

BACKGROUND OF THE INVENTION

A common requirement in integrated circuit fabrication is the etching of openings such as contacts and vias in dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molydenum silicide, etc.

Various plasma etching techniques for etching openings in silicon oxide are disclosed in U.S. Pat. Nos. 5,013,398; 5,013,400; 5,021,121; 5,022,958; 5,269,879; 5,529,657; 5,595,627; 5,611,888; and 5,780,338. The plasma etching can be carried out in medium density reactors such as the parallel plate plasma reactor chambers described in the '398 patent or the triode type reactors described in the '400 patent or in high density reactors such as the inductive coupled reactors described in the '657 patent. Etching gas chemistries include the oxygen-free, Ar, $CHF_3$ and optional $CF_4$ gas mixture described in the '121 and '958 patents, the oxygen-free, fluorine-containing and nitrogen gas mixture described in the '879 patent, the $C_4F_8$ and CO gas mixture described in the '627 patent, the oxygen and $CF_4$ gas mixture described in the '400 patent, the oxygen, $CF_4$ and $CH_4$ gas mixture described in the '657 patent, and the Freon and neon gas mixture described in the '888 patent.

U.S. Pat. No. 5,736,457 describes single and dual "damascene" metallization processes. In the "single damascene" approach, vias and conductors are formed in separate steps wherein a metallization pattern for either conductors or vias is etched into a dielectric layer, a metal layer is filled into the etched grooves or via holes in the dielectric layer, and the excess metal is removed by chemical mechanical planarization (CMP) or by an etch back process. In the "dual damascene" approach, the metallization patterns for the vias and conductors are etched in a dielectric layer and the etched grooves and via openings are filled with metal in a single metal filling and excess metal removal process.

Medium density plasma reactors operate at higher chamber pressures and dissociate etching gas chemistries to a lesser extent than high density plasma reactors. For instance, in medium density plasma reactors, etching gases such as $C_4F_8$ dissociate in stages as follows: $C_4F_8 \rightarrow C_2F_8 \rightarrow CF_2 \rightarrow CF+F$. Due to such gradual dissociation, it is possible to achieve a high etch rate of a dielectric layer and a low etch rate of an overlying layer such as a photoresist or underlayer such as an etch stop layer. The ratio of such etch rates is referred to as the "etch selectivity ratio" and the high selectivity ratios obtainable in medium density plasma reactors promote complete etching of contacts, vias and conductor patterns. In contrast, in high density reactors, the instantaneous dissociation of etching gases can lead to low selectivity ratios due to the higher etch rates of the masking layer and etch stop layers. For example, in high density plasma reactors, $C_4F_8$ dissociates directly to free F and the high content of free F causes such rapid etching of the masking and/or etch stop layers that the etch selectivity ratio is unacceptably low.

As device geometries become smaller and smaller, the need for high etch selectivity ratios is even greater in order to achieve plasma etching of deep and narrow openings in dielectric layers such as silicon oxide. Accordingly, there is a need in the art for a high density plasma etching technique which provides high etch selectivity ratios and/or which achieves deep and narrow openings. Further, it would be highly desirable to achieve such opening geometries without bowing of the sidewalls of the openings.

SUMMARY OF THE INVENTION

The invention provides a process for plasma etching a dielectric layer, comprising the steps of introducing a semiconductor substrate into a high density plasma etching reactor, the semiconductor substrate including a masking layer and an electrically conductive or semiconductive layer underlying a dielectric layer. The dielectric layer can be etched in a single step to expose the electrically conductive or semiconductive layer and provide openings extending through the dielectric layer to the electrical conductive or semiconductive layer. The etching is performed by exposing the dielectric layer to an etching gas in an ionized state in the high density plasma etching reactor, the etching gas including fluorocarbon reactant and carbon monoxide and an optional inert carrier gas. In the process, the high density plasma causes the fluorocarbon to instantaneously disassociate into free F and free C and the carbon monoxide is present in an amount effective to increase selectivity of the etch rate of the dielectric layer to the etch rate of the masking layer.

According to one aspect of the invention, the dielectric layer comprises silicon oxide such as doped or undoped silicon dioxide, BPSG, PSG, TEOS, or thermal silicon oxide and the openings comprise grooves corresponding to a conductor pattern, via openings or contact openings. According to another aspect of the invention, the openings can be etched so as to have an aspect ratio of at least 3:1. The etching gas can include a hydrogen-containing and/or a hydrogen-free fluorocarbon reactant represented by $C_xF_yH_z$ wherein x is at least 1, y is at least 1 and z is equal to or greater than 0. For example, the fluorocarbon reactant can be selected from the group of $CF_4$, $C_4F_8$, $C_2F_6$, $C_3F_6$, $C_3F_8$, $C_5F_8$, $CH_3F$, $C_2HF_5$ and/or $CH_2F_2$. The electrically conductive or semiconductive layer can comprise a metal-containing layer selected from the group consisting of Al, Al alloys, Cu, Cu alloys, Ti, Ti alloys, doped or undoped polycrystalline or single crystal silicon, TiN, TiW, Mo, silicides of Ti, W, Co and/or Mo, etc.

The process of the invention can etch openings which are 0.30 μm, especially 0.25 μm or smaller sized openings with depths of at least 1.8 μm using a fluorocarbon reactant which comprises $C_xF_yH_z$ wherein x is 1 to 5, y is 1 to 8 and z is 0 to 3. As an example, the fluorocarbon reactant can comprise one or more gases selected from $C_2HF_5$, $CH_2F_2$, $C_2F_6$, $C_3F_6$, $C_4F_8$ and mixtures thereof. The optional carrier gas can be selected from the group consisting of Ar, He, Ne, Kr, Xe or mixtures thereof. The CO can be supplied to the plasma reactor at a flow rate of 25 to 250 sccm, the fluorocarbon can be supplied to the plasma reactor at a flow rate of 5 to 100 sccm, and the optional carrier gas can be supplied to the plasma reactor at a flow rate of 10 to 300 sccm. As an example, CO, fluorocarbon, and Ar can be supplied to the plasma reactor at flow rates of 50 to 200 sccm, 40 to 70 sccm and 50 to 150 sccm, respectively. During the etching step, the high density plasma reactor is preferably maintained at a vacuum pressure of 10 mTorr or below. The etching step can be followed by filling the openings with metal. The method of the invention can also include steps of forming a photoresist layer on the dielectric layer, patterning the photoresist layer to form a plurality of openings and the etching step forms a metallization pattern of conductor lines, via or contact openings in the dielectric layer. With the process, openings can be formed with an aspect ratio of at least 5:1. In the process, free F liberated by dissociation of the fluorocarbon reacts with the carbon monoxide to reduce the effects of the free F in attacking the masking layer.

The process of the invention thus provides a semiconductor manufacturing process wherein deep and narrow quarter micron and smaller openings can be plasma etched in dielectric materials such as doped and undoped silicon oxide. The plasma gas chemistry includes fluorocarbon and CO which cooperate to etch the dielectric material while providing a desired selectivity wit respect to the masking and stop layers.

BRIEF DESCRIPTION OF THE DRAWINGS

FIGS. 1a–d show schematic representations of a via-first dual-damascene structure which can be etched according to the process of the invention, FIG. 1a showing a pre-etch condition, FIG. 1b showing a post-etch condition in which a via has been etched, FIG. 1c showing the structure re-patterned for a trench etch and FIG. 1d showing a post-etch condition in which the trench has been etched;

FIGS. 2a–d show schematic representations of a trench-first dual-damascene structure which can be etched according to the process of the invention, FIG. 2a showing a pre-etch condition, FIG. 2b showing a post-etch condition in which a trench has been etched, FIG. 2c showing the structure re-patterned for a via etch and FIG. 2d showing a post-etch condition in which the via has been etched;

Figure 3A:
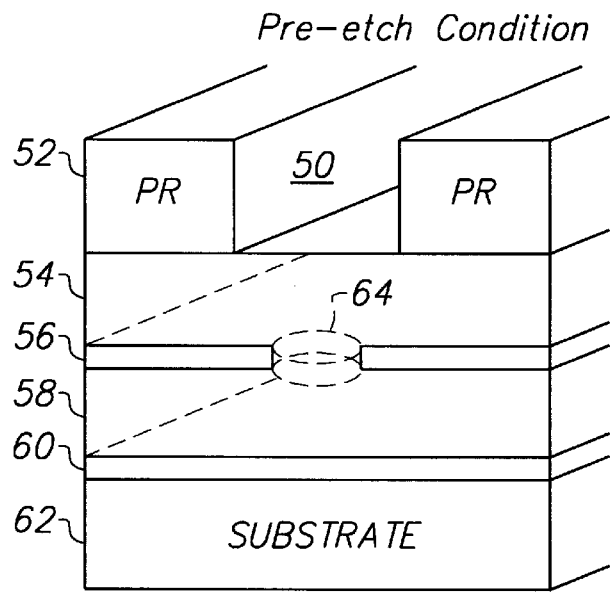
FIGS. 3a–b show schematic representations of a self-aligned dual-damascene structure which can be etched according to the process of the invention, FIG. 3a showing a pre-etch condition and FIG. 3b showing a post-etch condition in which a trench and a via have been etched.

DETAILED DESCRIPTION OF THE INVENTION invention provides a process of high density plasma etching of features such as contacts, vias, conductor lines, etc. in dielectric materials such as oxide layers in the manufacture of integrated circuits. The invention overcomes a problem with prior etching techniques wherein the selectivity between the dielectric etch rate and the masking and stop layers was too low for commercial applications. Such selectivity problems are solved in the invention by utilizing an etching gas chemistry which reduces the etch rates of the masking and/or stop layers.

According to one aspect of the invention, a single or dual-damascene etch process is provided wherein doped and undoped oxide films (BPSG, PSG, TEOS) can be etched with 0.25 µm or smaller geometry to an etch depth of at least 1.8 µm with an oxide:photoresist etch selectivity of greater than 5:1. The process can provide a low or reversed RIE lag, which can allow multi-level dielectric etch applications and enable the fabrication of dual-damascene devices.

FIGS. 1a–d show schematics of how a via-first dual-damascene structure can be etched in accordance with the invention. FIG. 1a shows a pre-etch condition wherein an opening 10 corresponding to a via is provided in a photoresist masking layer 12 which overlies a stack of a first dielectric layer 14 such as silicon oxide, a first stop layer 16 such as silicon nitride, a second dielectric layer 18 such as silicon oxide, a second stop layer 20 such as silicon nitride, and a substrate 22 such as a silicon wafer. FIG. 1b shows the structure after etching wherein the opening 10 extends through the dielectric layers 14, 18 and first stop layer 16 to the second stop layer 20. FIG. 1c shows the structure after re-patterning the masking layer for a trench 24. FIG. 1d shows the structure after etching wherein the first dielectric layer 14 is etched down to the first stop layer 16.

FIGS. 2a–d show schematics of how a trench-first dual-damascene structure can be etched in accordance with the invention. FIG. 2a shows a pre-etch condition wherein an opening 30 corresponding to a trench is provided in a photoresist masking layer 32 which overlies a stack of a first dielectric layer 34 such as silicon oxide, a first stop layer 36 such as silicon nitride, a second dielectric layer 38 such as silicon oxide, a second stop layer 40 such as silicon nitride, and a substrate 42 such as a silicon wafer. FIG. 2b shows the structure after etching wherein the opening 30 extends through the dielectric layer 34 to the first stop layer 36. FIG. 2c shows the structure after re-patterning the masking layer for a via 44. FIG. 2d shows the structure after etching wherein the second dielectric layer 38 is etched down to the second stop layer 40.

Figure 3B:
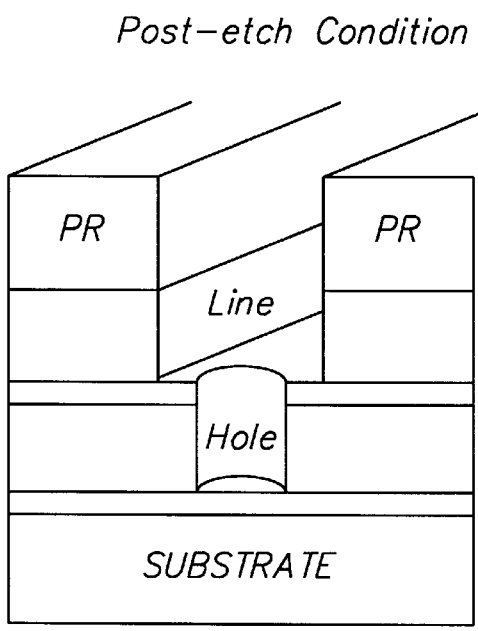

FIGS. 3a–b show schematics of how a dual-damascene structure can be etched in a single step in accordance with the invention. FIG. 3a shows a pre-etch condition wherein an opening 50 corresponding to a trench is provided in a photoresist masking layer 52 which overlies a stack of a first dielectric layer 54 such as silicon oxide, a first stop layer 56 such as silicon nitride, a second dielectric layer 58 such as silicon oxide, a second stop layer 60 such as silicon nitride, and a substrate 62 such as a silicon wafer. In order to obtain etching of vias through the first stop layer 56 in a single etching step, first stop layer 56 includes an opening 64. FIG. 2*b* shows the structure after etching wherein the opening 50 extends through the dielectric layer 54 to the first stop layer 56 and the opening 64 extends through the second dielectric 58 to the second stop layer 60. Such an arrangement can be referred to as a "self-aligned dual-damascene" structure.

The process of the invention is applicable to etching of various dielectric layers such as doped silicon oxide such as fluorinated silicon oxide (FSG), undoped silicon oxide such as silicon dioxide, spin-on-glass (SOG), silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molydenum silicide, etc.

High density plasma can be produced in various types of plasma reactors. Such plasma reactors typically have high energy sources which use RF energy, microwave energy, magnetic fields, etc. to produce the high density plasma. For instance, the high density plasma could be produced in a transformer coupled plasma (TCP™) which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Ser. No. 08/658,261, the disclosure of which is hereby incorporated by reference.

Figure 4:
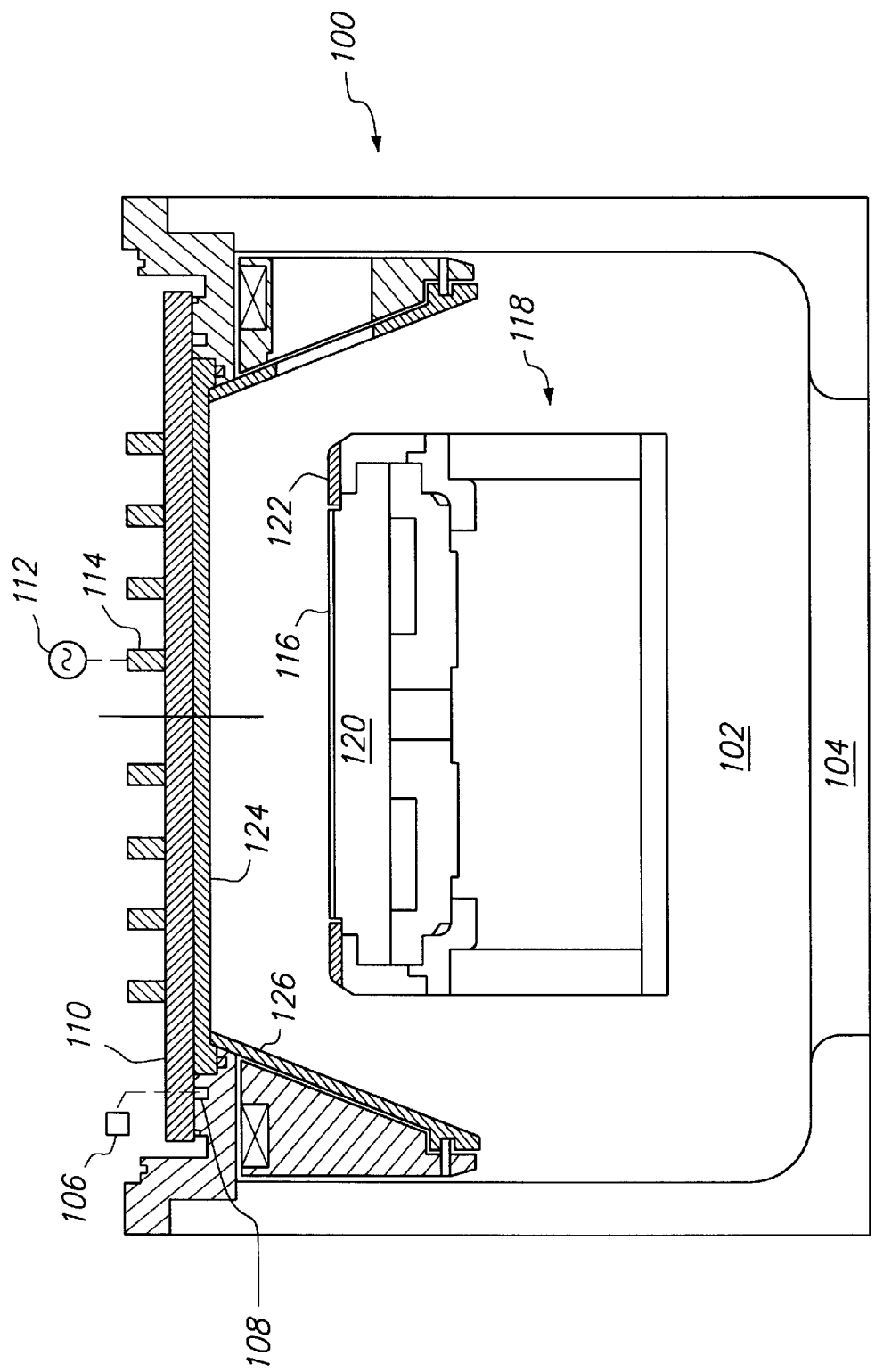
FIG. 4 shows a schematic representation of an inductively coupled high density plasma reactor which can be used to carry out the process of the invention.

The process of the invention can be carried out in an inductively coupled plasma reactor such as reactor 100 shown in FIG. 4. The reactor 100 includes an interior 102 maintained at a desired vacuum pressure by a vacuum pump connected to an outlet 104 in a lower wall of the reactor. Etching gas can be supplied to a showerhead arrangement be supplying gas from gas supply 106 to a plenum 108 extending around the underside of a dielectric window 110. A high density plasma can be generated in the reactor by supplying RF energy from an RF source 112 to an external RF antenna 114 such as a planar spiral coil having one or more turns outside the dielectric window 110 on top of the reactor. The plasma generating source can be part of a modular mounting arrangement removably mounted in a vacuum tight manner on the upper end of the reactor.

A semiconductor substrate 116 such as a wafer is supported within the reactor on a substrate support 118 such as a cantilever chuck arrangement removably supported by a modular mounting arrangement from a sidewall of the reactor. The substrate support 118 is at one end of a support arm mounted in a cantilever fashion such that the entire substrate support/support arm assembly can be removed from the reactor by passing the assembly through an opening in the sidewall of the reactor. The substrate support 118 can include a chucking apparatus such as an electrostatic chuck 120 and the substrate can be surrounded by a dielectric focus ring 122. The chuck can include an RF biasing electrode for applying an RF bias to the substrate during an etching process. The etching gas supplied by gas supply 106 can flow through channels between the window 110 and an underlying gas distribution plate 124 and enter the interior 102 through gas outlets in the plate 124. The reactor can also include a heated liner 126 extending conically from the plate 124.

In one embodiment, the invention provides a process for plasma etching 0.3 μm and smaller high aspect ratio features such as conductor lines, vias and contacts including self aligned contacts (SAC) in dielectric layers on semiconductor substrates. In the process, a gas mixture containing fluorocarbon, carbon monoxide and optional gases such as a carrier gas (e.g., argon) is energized in a high density plasma reactor into a plasma state such that the fluorocarbon is instantaneously dissociated into free F and free C. During the etching process, the carbon monoxide is instantaneously dissociated into free C and free oxygen by the high density plasma and the free C reacts with some of the free F to thereby reduce the etch rate of the masking and/or stop etch layers. As a result, the CO is effective in providing a desired level of selectivity between the etch rates of the dielectric material being etched and an underlayer such as silicon nitride and/or an overlayer such as a photoresist while at the same time balancing polymer build-up sufficiently to protect sidewalls of etched features while avoiding pinch-off and etch stop problems due to excessive polymer build-up. Etch stop is especially problematic during plasma etching of deep and narrow openings in dielectric materials such as silicon oxide using gas chemistries which form too much polymer, i.e., polymer-build-up in the opening prevents further etching of the silicon oxide. In the process of the invention, the polymer build-up can be reduced by the synergistic effect of breaking up the polymer with the carbon monoxide in the etching gas mixture. Further, in order to preserve the critical dimension(CD) of the etched feature, the CO removes enough of the polymer build-up on the sidewalls of the etched openings to avoid excessive build-up of polymer on the sidewalls which otherwise could cause "pinch-off" of the etched openings and thus prevent complete etching of the opening to the desired depth.

According to the invention, carbon monoxide is added in an amount effective to control the etch rate selectivity ratio of the etching gas chemistry. That is, when using an etching gas containing CO and one or more fluorocarbon gases, the CO is effective to scavenge free F dissociated from the fluorocarbon in the high density plasma. Such free F attacks layers such as the masking and etch stop layers resulting in low etch rate selectivity. However, by supplying CO at a suitable level it is possible to scavenge a sufficient amount of the free F to thereby increase the selectivity ratio. The CO is preferably supplied to the plasma etching reactor in amounts effective to scavenge free F and prevent etch stop by reacting with polymer at the bottom of the etched openings. For a high density plasma reactor which inductively couples RF energy into the reactor using a planar coil antenna, the advantageous effects of the invention can be achieved by supplying CO to the reactor at a flow rate of 50 to 250 sccm.

The etching gas mixture may optionally include other gases such as nitrogen and/or an inert carrier gas. Argon is an especially useful inert carrier gas which aids fluorine in attacking dielectric materials such as silicon oxide. However, other inert gases such as He, Ne, Kr and/or Xe can be used as the inert carrier gas. In order to maintain low pressure in the plasma etching reactor, the amount of carrier gas introduced into the reactor can be at low flow rates. For instance, for a high density plasma reactor, argon can be supplied into the reactor in amounts of 25 to 300 sccm. The carrier gas preferably aids the dielectric etch rate, e.g., the oxide etching rate can be increased due to sputtering of the oxide.

The fluorocarbon preferably comprises $C_xF_yH_z$ wherein x is at least 1, y is at least 1 and z is 0 or above, e.g., $CF_4$, $C_3F_6$, $C_3F_8$, $C_5F_8$, $C_4F_8$, $C_2F_6$, $CH_2F_5$, $C_2HF_5$, $CH_3F$, $CH_2F_2$, etc. Although hydrogen containing fluorocarbons are quite polymerizing, in order to avoid the etch step phenomenon, it is possible to use hydrogen-free fluorocarbon gases so that the degree of polymerizing can be controlled to achieve deep and narrow openings through the use of a synergistic combination of the CO addition. The amount of fluorocarbon gas to be supplied to the plasma reactor should be sufficient to achieve the desired degree of polymerizing. As an example, in a high density plasma reactor wherein RF energy is inductively coupled into the reactor, the CO can be supplied at flow rates of 50 to 250 sccm and the fluorocarbon gas can be supplied in total amounts of 25 to 150 sccm, preferably 40 to 100 sccm, and more preferably 60 to 70 sccm. As an example, for 0.25 μm diameter contact openings, the CO flow rate can range from 50 to 200 sccm when $C_xF_yH_z$ is supplied at 40 to 70 sccm, and argon, if supplied, can range from 50 to 150 sccm. It will be apparent to those skilled in the art that the flow rates of the various gases will depend on factors such as the type of plasma reactor, the power settings, the vacuum pressure in the reactor, the dissociation rate for the plasma source, etc.

The process of the invention is useful for obtaining extremely high aspect ratios of at least 5:1, the process being especially useful for obtaining aspect ratios up to 10:1 for openings smaller than 0.3 μm, preferably as small as 0.18 and below. For example, it is possible to obtain substantially straight walls for 0.25 μm diameter openings at depths greater than 2.1 μm. In order to provide anisotropic etching, it is beneficial to supply an RF bias to the semiconductor substrate by the substrate support. For instance, an RF biasing electrode in the substrate support can be supplied with power on the order of 500 to 3000 Watts to adequately RF bias 6, 8 or even 12 inch wafers.

The reactor pressure is preferably maintained as low as possible. In general, too low a reactor pressure can lead to plasma extinguishment whereas too high a reactor pressure can lead to the etch stop problem. For high density plasma reactors, the reactor is preferably at a pressure below 30 mTorr, more preferably below 10 mTorr. Due to plasma confinement at the semiconductor substrate undergoing etching, the vacuum pressure at the substrate surface may be higher than the vacuum pressure setting for the reactor.

The substrate support supporting the semiconductor substrate undergoing etching preferably cools the substrate enough to prevent burning of any photoresist on the substrate, e.g., maintain the substrate below 140° C. In high density plasma reactors, it is sufficient to cool the substrate support to a temperature of −20 to 40° C. The substrate support can comprise a bottom electrode such as an ESC on which a substrate such as a silicon wafer is electrostatically clamped and cooled by supplying helium at a desired pressure between the wafer and top surface of the ESC. In order to maintain the wafer at a desired temperature of, for example, 0 to 100° C., the He can be maintained at a pressure of 10 to 30 Torr in the space between the wafer and the chuck.

When practicing the invention with an inductively coupled plasma reactor like the one shown in FIG. 4, the planar coil antenna can be supplied with RF energy supplied at a frequency of 13.46 MHZ and at power levels of 1000 to 4000 Watts. The power should be sufficient to instantaneously dissociate the fluorocarbon to free F and free C. As explained earlier, such intense plasmas cause selectivity problems during etching of dielectric materials such as doped or undoped silicon oxide, e.g., undoped silicate glass (USG), boron phosphorus silicate glass (BPSG), phosphorus silicate glass (PSG), spin on glass (SOG), doped or undoped TEOS, fluorinated silicon oxide (SiOF), thermal oxide, or other form of silicon oxide.

The process of the invention is especially well suited for etching deep and narrow openings through silicon oxide to an underlying conductive or semiconductive layer. This layer can be a metal such as Al, Ti, Cu, Mo or alloys thereof, a metal nitride such as titanium nitride, doped or undoped polycrystalline or single crystal silicon, a metal silicide such as titanium silicide, tungsten silicide, cobalt silicide, molybdenum silicide, etc. In the case where oxygen is added to the etching gas mixture, the underlying conductive material preferably excludes materials which are attached by oxygen such as silicon nitride.

Figure 5:
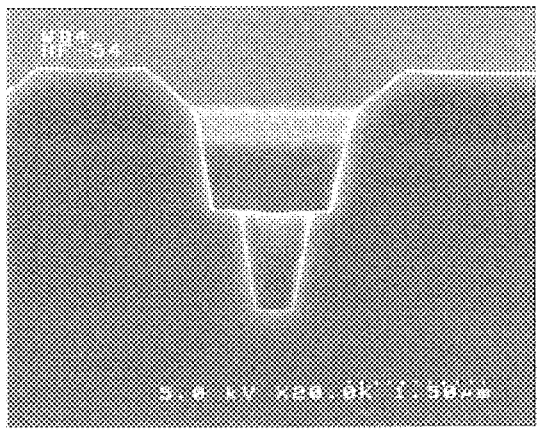
FIG. 5 is a SEM micrograph of a dual-damascene structure etched in accordance with the invention.

An example of a high density etch process in accordance with the invention is as follows. When using an inductively coupled high density plasma etching reactor such as the 9100PTX™ available from LAM Research Corporation, the vacuum pressure can be set at 5 mTorr, the power to the planar coil antenna outside the reactor can be set at 1300 Watts, the power to the RF biasing electrode in the electrostatic chuck can be set at 1700 Watts, and the helium supplied between the wafer and the chuck can be set at 20 Torr. FIG. 5 is a SEM micrograph of a structure etched with the following etching gas mixture: 200 sccm CO, 35 sccm $CH_2F_2$, and 25 sccm $C_4F_8$.

Figure 6:
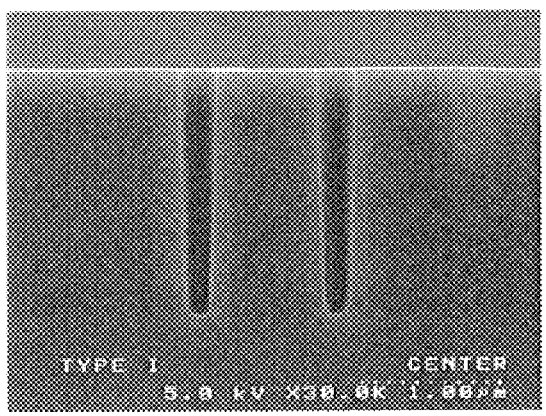
FIG. 6 is a SEM micrograph of a TEOS over Si structure at the center of a wafer etched in accordance with the invention.
Figure 7:
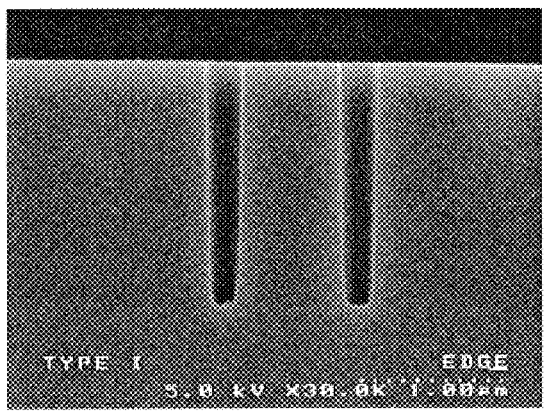
FIG. 7 is a SEM micrograph of a TEOS over Si structure at the edge of a wafer etched in accordance with the invention.
Figure 8:
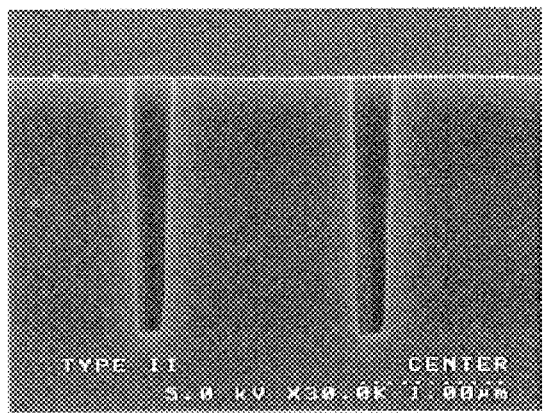
FIG. 8 is a SEM micrograph of a PSG over $Si_3N_4$ structure at the center of a wafer etched in accordance with the invention.
Figure 9:
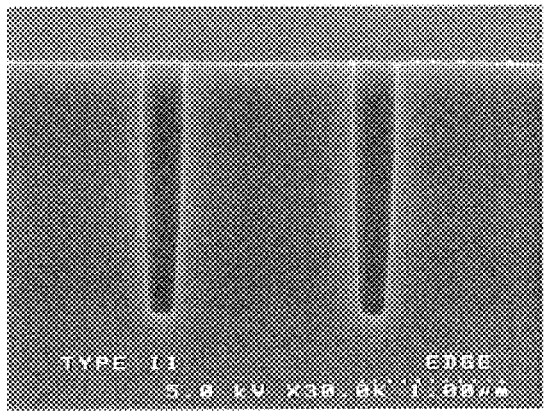
FIG. 9 is a SEM micrograph of a PSG over $Si_3N_4$ structure at the edge of a wafer etched in accordance with the invention.

FIGS. 6–9 are SEM micrographs of etched contacts wherein the photoresist layer has been removed. FIGS. 6 and 7, show center and edge profiles, respectively, of 0.25 μm diameter and 1.8 μm deep contact openings about 50% overetched in a TEOS dielectric layer over a Si stop layer. FIGS. 8 and 9 show center and edge profiles, respectively, of 0.25 μm diameter and 1.8 μm deep contact openings about 50% overetched in a PSG dielectric layer over a $Si_3N_4$ stop layer.

The following Table 1 sets forth results of etching dual-damascene structures using various reactor pressures, $CH_2F_2$, $C_4F_8$ and CO gas flow rates.

TABLE 1

| Run | Pressure (mTorr) | $CH_2F_2$ (sccm) | $C_4F_8$ (sccm) | CO (sccm) | TEOS (A/min) | Nitride (A/min) | TEOS: Nitride Selectivity |
|---|---|---|---|---|---|---|---|
| 1 | 10 | 35 | 25 | 200 | 1136 | 85 | 13.4:1 |
| 2 | 5 | 40 | 30 | 150 | 4766 | 244 | 19.53:1 |
| 3 | 5 | 30 | 30 | 250 | 1250 | 86 | 14.53:1 |
| 4 | 15 | 40 | 20 | 150 | 0 | 1210 | |
| 5 | 5 | 30 | 20 | 150 | 3852 | 148 | 26.03:1 |
| 6 | 5 | 40 | 20 | 250 | 0 | 1234 | |
| 7 | 15 | 30 | 30 | 150 | 933 | 166 | 5.62:1 |
| 8 | 15 | 40 | 30 | 250 | 0 | 0 | |
| 9 | 15 | 30 | 20 | 250 | 0 | 0 | |
| 10 | 10 | 35 | 25 | 200 | 1073 | 114 | 9.4:1 |

The following Table 2 sets forth test results including etch rates for various size openings and etch rates of the photoresist masking layer for above Run Nos. 1–10.

TABLE 2

| Run | 0.4 μm E/R (A/min) | 0.5 μm E/R (A/min) | 0.6 μm E/R (A/min) | 0.5 μm PR E/R (A/min) | 0.5 μm PR Sel. (Facet) | 0.5 μm Uniformity (%, ±) |
|---|---|---|---|---|---|---|
| 1 | 4733 | 4757 | 4889 | 640 | 7.43 | 5.7 |
| 2 | 6153 | 5893 | 6331 | 953 | 6.18 | 4.9 |

TABLE 2-continued

| Run | 0.4 μm E/R (A/min) | 0.5 μm E/R (A/min) | 0.6 μm E/R (A/min) | 0.5 μm PR E/R (A/min) | 0.5 μm PR Sel. (Facet) | 0.5 μm Uniformity (%, ±) |
|---|---|---|---|---|---|---|
| 3 | 5400 | 5088 | 5174 | 1224 | 4.16 | 9.2 |
| 4 | 4529 | 4691 | 4756 | 464 | 10.1 | 4.3 |
| 5 | 5290 | 4666 | 4711 | 1268 | 3.68 | 7.6 |
| 6 | 4913 | 4443 | 4396 | 757 | 5.87 | 1.0 |
| 7 | 5462 | 6130 | 6199 | 807 | 7.60 | 8.7 |
| 8 | 5045 | 4885 | 5137 | 407 | 12.0 | 5.5 |
| 9 | 4311 | 4422 | 4579 | 220 | 20.1 | 8.5 |
| 10 | 4865 | 4912 | 4955 | 697 | 7.05 | 6.1 |

Based on observations in carrying out the above tests, an optimal regime for dielectric etching in accordance with the process of the invention is as follows. To prevent etch stop at high CO flow rates, it is advantageous to set the chamber pressure at 10 mTorr or below. It is also desirable to maintain the chamber pressure at 10 mTorr or below to obtain high underlayer etch rate selectivity. However, the photoresist selectivity appears to be higher at higher chamber pressure settings. The optimal CO flow rate appears to be in the range of 50 to 200 sccm. When the CO flow rate is 250 sccm or higher, etch stop occurs regardless of chamber pressure setting. For profile and selectivity purposes, an optimal etching gas mixture is $CH_2F_2$ and $C_4F_8$ in a ratio of 1:1 to 1.5:1. Also, reversed RIE lag is more likely to occur at low pressure settings.

The process according to the invention was developed as a result of the following measurements performed on wafers having the following structures: TEOS etch rate and RIE lag measurements on a wafer having 11600 A I-line photoresist over 20000 A TEOS over a Si substrate; $Si_3N_4$ etch rate and selectivity measurements on a wafer having 10000 A I-line photoresist over 3000 A $Si_3N_4$ over 1000 A thermal oxide over a Si substrate; 0.25 μm and 0.35 μm PSG etch rate and selectivity measurements on a wafer having 8250 A DUV resist over 17000 A PSG over 1000 A $Si_3N_4$ over a silicon substrate; 0.25 μm and 0.35 μm TEOS etch rate and selectivity measurements on a wafer having 10000 A DUV resist over 18000 A TEOS over a silicon substrate; and oxide dual-damascene structure wafers having 6000 A DUV resist, 7000 A TEOS trench (0.3 μm to 1.0 μm CD), 1500 A $Si_3N_4$, 10000 A TEOS via (0.35 μm to 0.60 μm CD), 1500 A $Si_3N_4$, and a silicon substrate. The RIE lag of 0.4 μm contacts at 1.2 μm depth was calculated from SEM photomicrographs using the formula: RIE lag=100*(open area etch rate−0.4 μm contact etch rate)/open area etch rate. Oxide etch rate uniformity measurements were determined from SEMs using the following formula: % Uniformity=(feature size center−feature size edge)×100/(feature size center+feature size edge).

As a result of experiments performed, it was determined that a preferred center point dielectric etching process using the LAM 9100PTX™ reactor is as follows: 10 mTorr chamber pressure, 1300 Watts top electrode (TCP coil) power, 1500 Watts bottom electrode (ESC) power, 35 sccm $CH_2F_2$, 25 sccm $C_4F_8$ and 200 sccm CO. In general, the chamber pressure can range from 5 to 15 mTorr, the bottom electrode temperature can be about +20° C., the helium supplied between the wafer and the ESC can be at about 20 Torr, the $CH_2F_2$ flow rate can range from 30 to 40 sccm, the $C_4F_8$ flow rate can range from 20 to 30 sccm and the CO flow rate can range from 150 to 250 sccm. While the foregoing reactor settings achieved heretofore unobtainable etch rate selectivities in etching damascene structures in a high density plasma reactor, it will be apparent to those skilled in the art that optimal reactor settings will vary with choice of reactor and gas chemistry variations.

In comparative experiments, the following etching gas chemistries were evaluated as set forth in the following Table 3:

TABLE 3

| Chemistry | Results |
|---|---|
| $Ar/C_2F_6/C_4F_8/O_2$ | TEOS:$Si_3N_4$ selectivity too low |
| $Ar/CH_2F_2/C_4F_8$ | Does not etch undoped film; $Si_3N_4$ selectivity in >0.5 μm features low |
| $Ar/CH_2F_2/C_4F_8/CO$ | No notable advantage over same gas mixture without Ar |
| $C_4F_8/CO$ | Higher oxide etch rate, better open area uniformity, less PR facet; PR selectivity >4:1; Oxide:nitride selectivity low |
| $C_2HF_5/C_4F_8/CO$ | More vertical profile compared to $CH_2F_2/C_4F_8/CO$; Oxide:nitride selectivity low |
| $C_2HF_5/CH_2F_2$ | TEOS etch depth <1.0 μm in features ≦0.5 μm size; Oxide:nitride selectivity low |
| $C_2HF_5/CH_2F_2/CO$ | Oxide:nitride selectivity low |

The effects of different CO flow rates on various parameters are set forth in the following Table 4, wherein the reactor was operated at 4 mTorr pressure, 1300 Watts top electrode power, 1600 Watts bottom electrode power, 36 sccm $CH_2F_2$, 24 sccm $C_4F_8$, 100 sccm Ar and 20 Torr He for back cooling the wafer.

TABLE 4

| CO (Sccm) | 0.4 μm etch depth | open area E/R (A/min) | 0.4 μm E/R (A/min) | open area TEOS/ $Si_3N_4$ Sel. | 0.5 μm TEOS/ PR Sel. | RIE lag (0.4 μm v. open) |
|---|---|---|---|---|---|---|
| 0 | 2000 | 8425 | 0 | 9.06 | ≧1.96 | +100% |
| 50 | 5000 | 7054 | 9193 | 12.50 | ≧5.23 | −26% |
| 100 | 10000 | 3888 | 7280 | 11.88 | ≧3.74 | −95% |
| 200 | >10500* | 1143 | 6267 | ⁻15.0 | ≧5.82 | >−400% |

*No sign of etch stop at given etch time

Figure 10:
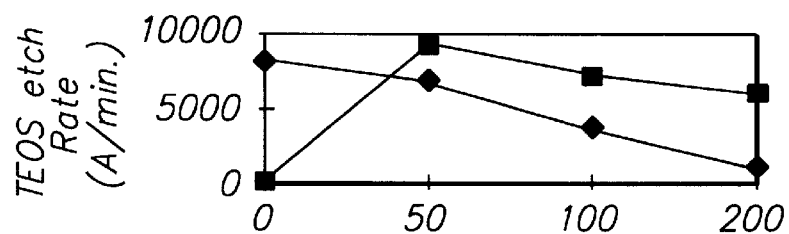
FIG. 10 is a graph showing the effects of CO flow rates on the etch rate of TEOS, the etch rate increasing steadily to 50 sccm CO.

Additional results achieved by the process according to the invention are shown in FIGS. 10–13. FIG. 10 is a graph of TEOS etch rate versus CO flow rate wherein the ♦ indicate etch rate in open areas and the ■ indicate the etch rate in the 0.4 μm openings. As shown in the graph, the etch rate in the openings surprisingly increases rapidly with CO flow rates up to 50 sccm and the etch rate is fairly constant at CO flow rates between 50 and 200 sccm. On the other hand, the open area etch rates are at a maximum without CO additions and drops to near 0 as the CO flow rate increases to 200 sccm.

Figure 11:
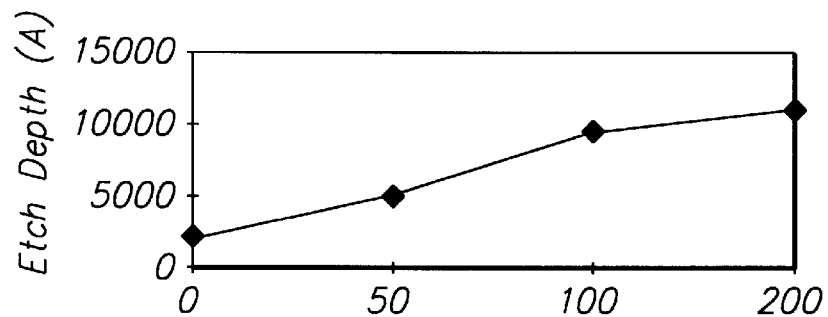
FIG. 11 is a graph showing the effects of CO flow rates on the etch depth of TEOS, the etch rate increasing steadily to 200 sccm CO.

FIG. 11 is a graph of TEOS etch depth versus CO flow rate wherein the ♦ indicate etch depth for the 0.4 μm openings. As shown in the graph, the etch depth of the openings increases gradually with CO flow rates up to 200 sccm.

Figure 12:
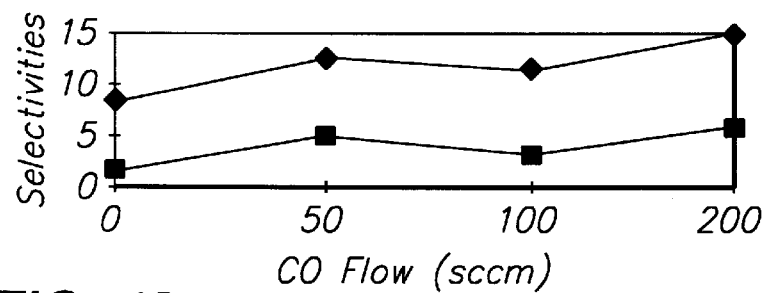
FIG. 12 is a graph of selectivity versus CO flow rate.

FIG. 12 is a graph of Selectivities versus CO flow rate wherein the ♦ indicate TEOS:$Si_3N_4$ selectivity and the ■ indicate TEOS:Photoresist (PR) selectivity. As shown in the graph, the TEOS:PR selectivity is below 3 when the etching gas does not contain CO and the selectivity approaches 5 as the CO flow rate is increased to 50 sccm. On the other hand, the TEOS:$Si_3N_4$ selectivity is below 10 without CO additions and increases to 15 as the CO flow rate increases to 200 sccm.

Figure 13:
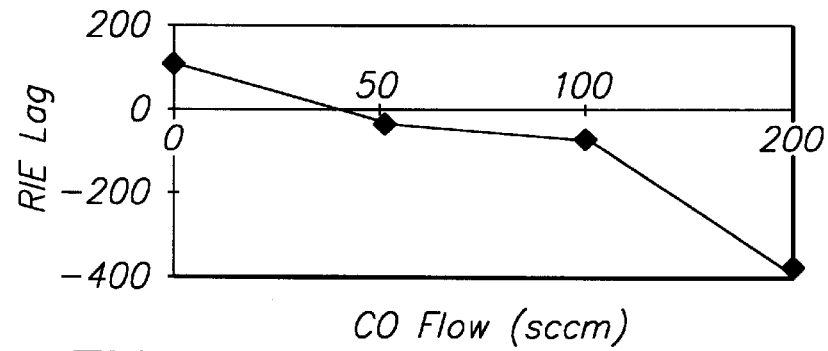
FIG. 13 is a graph of RIE lag versus CO flow rate, the RIE lag being in negative numbers for CO flow rates above 50 sccm.

FIG. 13 is a graph of RIE lag versus CO flow rate wherein the ♦ indicate the ratios of etch rates of 0.4 μm openings compared to open areas as CO is increased from 0 to 200 sccm. As shown in the graph, at 50 sccm CO and above, the RIE lag is negative, indicating that the open areas are etching slower than the contact openings.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A process for etching a dielectric layer, comprising the steps of:
   introducing a semiconductor substrate into a high density plasma etching reactor, the semiconductor substrate having a masking layer over a dielectric layer and an electrically conductive or semiconductive layer underlying the dielectric layer;
   supplying etching gas to the plasma etching reactor and energizing the etching gas into a high density plasma state, the etching gas consisting essentially of a fluorocarbon reactant of $C_4F_8$ and $CH_2F_2$ and carbon monoxide; and
   exposing the masking layer and exposed portions of the dielectric layer to the high density plasma so as to etch openings in the dielectric layer with the high density plasma, the etching rate of the dielectric layer to the etching rate of the masking layer being at least about 5.

2. The process of claim 1, wherein the dielectric layer comprises a doped or undoped silicon oxide film.

3. The process of claim 1, wherein the openings are etched to a depth sufficient to provide an aspect ratio of at least 3:1.

4. The process of claim 1, wherein the electrically conductive or semiconductive layer comprises a metal-containing layer selected from the group consisting of doped and undoped polycrystalline or single crystal silicon, aluminum, copper, titanium, tungsten, molybdenum or alloys thereof, titanium nitride, titanium silicide, tungsten silicide, cobalt silicide, and molybdenum silicide.

5. The process of claim 1, wherein the openings are 0.25 micron or smaller sized openings.

6. The process of claim 1, further comprising supplying to the plasma etching reactor a carrier gas selected from the group consisting of Ar, He, Ne, Kr, Xe or mixtures thereof.

7. The process of clam 1, wherein the high density plasma reactor is formed by inductively coupling RF energy into the plasma reactor and the fluorocarbon reactant is supplied to the plasma reactor at a flow rate of 5 to 100 sccm.

8. The process of claim 1, wherein the carbon monoxide is supplied to the plasma reactor at a flow rate of 150 to 250 sccm.

9. The process of claim 1, further comprising applying an RF bias to the semiconductor substrate during the etching step.

10. The process of claim 1, further comprising filling the openings with metal after the etching step.

11. The process of claim 1, wherein the etching step is carried out as part of a process of manufacturing a damascene structure.

12. The process of claim 1, further comprising steps of forming a photoresist layer as the masking layer, patterning the photoresist layer to form a plurality of the openings and the etching step forms via or contact openings in the silicon oxide.

13. The process of claim 1, wherein the openings are formed with an aspect ratio of at least 5:1.

14. The process of claim 1, wherein the etching gas supplied to the plasma reactor does not include pure oxygen as a component thereof.

15. The process of claim 1, wherein the plasma reactor is at a pressure of less than 10 mTorr during the etching step.

16. The process of claim 1, wherein the semiconductor substrate comprises a silicon wafer and the wafer is maintained at a temperature of no greater than 130° C. during the etching step.

17. The process of claim 1, wherein the etching is carried out until the openings extend through the dielectric layer to the electrically conductive or semiconductive layer.

18. The process of claim 1, wherein the etching gas is free of nitrogen.

19. The process of claim 1, wherein the high density plasma causes the carbon monoxide to instantaneously disassociate into free C and free oxygen.

20. The process of claim 1, wherein the volumetric flow ratio of carbon monoxide to fluorocarbon reactant supplied to the plasma reactor is in the range of 2.15:1 to 5:1.

21. The process of claim 20, wherein the volumetric flow ratio of carbon monoxide to fluorocarbon reactant supplied to the plasma reactor is in the range of 3:1 to 5:1.

22. The process of claim 20, wherein the etching gas is energized into a high density plasma state by applying power at a level in the range of 2500–4000 Watts.

23. The process of claim 22, wherein RF energy is inductively coupled into the plasma reactor at a power of greater than or equal to 1300 Watts and wherein an RF bias is, applied to the semiconductor substrate at a power of greater than or equal to 1500 Watts.

24. The process of claim 1, wherein the carbon monoxide breaks up polymer deposits, thereby reducing polymer build-up on sidewalls of the openings in the dielectric layer.

25. The process of claim 1, wherein the fluorocarbon reactant is supplied to the plasma reactor at a flow rate of 5 to 100 sccm and wherein the carbon monoxide is supplied to the plasma reactor at a flow rate of 150 to 250 sccm.

26. The process of claim 25, wherein the fluorocarbon reactant is supplied to the plasma reactor at a flow rate of 40 to 70 sccm and the carbon monoxide is supplied to the plasma reactor at a flow rate of 150 to 200 sccm.

27. The process of claim 1, wherein the volumetric flow ratio of $CH_2F_2$ to $C_4F_8$ is in the range of 1:1 to 1.5:1.

* * * * *